United States Patent [19]

Nagai et al.

[11] Patent Number: 4,562,408
[45] Date of Patent: Dec. 31, 1985

[54] AMPLIFIER HAVING A HIGH POWER SOURCE NOISE REPRESSION RATIO

[75] Inventors: Kenji Nagai, Kodaira; Fumiaki Fujii, Tokyo, both of Japan

[73] Assignee: Hitachi, Ltd., Tokyo, Japan

[21] Appl. No.: 560,873

[22] Filed: Dec. 13, 1983

[30] Foreign Application Priority Data

Dec. 13, 1982 [JP] Japan .................................. 57-216845

[51] Int. Cl.$^4$ .............................................. H03F 3/16
[52] U.S. Cl. ..................................... 330/253; 330/277; 330/294
[58] Field of Search .................. 330/86, 253, 277, 311, 330/294

[56] References Cited

U.S. PATENT DOCUMENTS

| | | | |
|---|---|---|---|
| 4,048,575 | 9/1977 | Musa | 330/253 |
| 4,335,355 | 6/1982 | Haque | 330/253 |
| 4,379,267 | 4/1983 | Young | 330/253 |
| 4,383,223 | 5/1983 | Ulmer | 330/253 |
| 4,458,212 | 7/1984 | Brehmer et al. | 330/253 X |

FOREIGN PATENT DOCUMENTS

| | | | |
|---|---|---|---|
| 0025970 | 4/1981 | European Pat. Off. | |
| WO81/00938 | 4/1981 | PCT Int'l Appl. | |
| WO82/02128 | 6/1982 | PCT Int'l Appl. | |
| 2071447 | 9/1981 | United Kingdom | 330/253 |
| 2080649 | 2/1982 | United Kingdom | 330/253 |

Primary Examiner—James B. Mullins
Assistant Examiner—Steven J. Mottola
Attorney, Agent, or Firm—Antonelli, Terry & Wands

[57] ABSTRACT

An amplifier comprising a pair of differential input MISFETs, a current mirror circuit connected between the drains of the differential input MISFETs and a power source terminal, a phase compensation circuit connected to the drain of one of the differential input MISFETs, an output stage amplification circuit amplifying the signal produced at the drain of one of the differential input MISFETs, a phase regulation circuit such as a capacitor connected to the other of the differential input transistors, and a feedback circuit feeding back the output signal produced from the output stage amplification circuit to the other of the differential input MISFETs in order to apply negative feedback to the amplifier. Since the capacitor is provided, the phase of the power source noise can be made substantially equal to the phase of noise occurring at the drain of one of the differential input MISFETs due to the power source noise. Hence, hardly any noise is produced from the output stage amplification circuit. Since feedback is applied to the amplifier, the noise occurring at the drain of the other of the differential input MISFETs operates in such a manner as to limit the amount of change of the drain voltage of one of the differential input MISFETs due to the noise. As a result, a large change of the output signal due to the power source noise can be prevented. Furthermore, since an element to be added for this purpose may be merely a capacitor, a significant increase in the number of circuit elements can be avoided.

34 Claims, 5 Drawing Figures

AMPLIFIER HAVING A HIGH POWER SOURCE NOISE REPRESSION RATIO

BACKGROUND OF THE INVENTION

This invention relates generally to an amplifier and more particularly, to an operational amplifier suitable for use in an MIS integrated circuit constituted of MISFETs (insulated gate field effect transistors).

Figure 1:
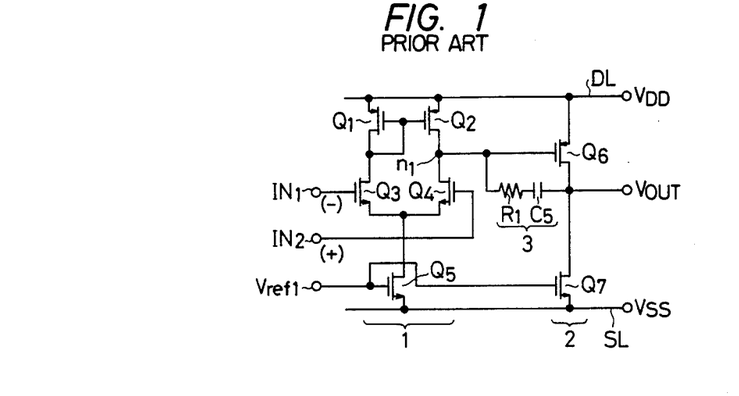
FIG. 1 is a circuit diagram of a prior art amplifier.

An amplifier having the circuit construction shown in FIG. 1 has been known in the past. In the drawing, reference numeral 1 denotes a differential input stage, 2 is an output amplification stage and 3 is a phase compensation circuit.

The differential input stage 1 consists of a pair of differential input MISFETs $Q_3$ and $Q_4$, load MISFETs $Q_1$ and $Q_2$ that are interposed between the drains of these MISFETs $Q_3$, $Q_4$ and a power source line DL and form a current mirror circuit, and a constant current MISFET $Q_5$ interposed between the common source of the differential input MISFETs $Q_3$ and $Q_4$ and the reference potential line SL of the circuit.

The output amplification stage 2 consists of an MISFET $Q_6$ interposed between the power source line DL and an output terminal $V_{out}$ and a constant current MISFET $Q_7$ interposed between the output terminal $V_{out}$ and the reference potential line SL of the circuit.

The phase compensation circuit 3 consists of a resistor $R_1$ and a capacitor $C_5$ that are connected in series between the output terminal $V_{out}$ and the drain of MISFET $Q_2$ described above.

A reference voltage $V_{ref1}$ is applied to the gates of MISFETs $Q_5$ and $Q_7$ so that these transistors $Q_5$ and $Q_7$ operate as constant current sources.

MISFETs $Q_1$, $Q_2$ and $Q_6$ are p-channel MISFETs while MISFETs $Q_3$, $Q_4$, $Q_5$ and $Q_7$ are n-channel MISFETs.

The amplifier described above can constitute a voltage follower by connecting its inversion input terminal $IN_1$ to its output terminal $V_{out}$ so as to have its non-inversion input terminal $IN_2$ function as the input terminal.

If this input terminal $IN_2$ is connected to a ground potential point, the voltage follower is believed to be substantially insensitive to the power source noise. In other words, when the potential of the power source line DL moves up and down due to the power source noise, the potential at a node $n_1$ and the source potential of MISFET $Q_6$ also move up and down in response to the former. Accordingly, transient noise appears at the output terminal $V_{out}$. Since the output terminal $V_{out}$ is connected to the inversion input terminal $IN_1$, that is, since feedback is applied, however, it is generally believed that virtually no noise appears at the output terminal $V_{out}$.

As a result of examination of the voltage follower composed of the amplifier described above, however, the inventors of the present invention have found that noise does appear at the output terminal $V_{out}$ when noise of a relatively high frequency is applied to the power source voltage.

In other words, since the phase compensation circuit 3 or the like is disposed at the drain of MISFET $Q_2$, the value of capacitance coupled to this transistor $Q_2$ and the value of capacitance coupled to the drain of MISFET $Q_1$ do not balance with each other, so that a phase difference occurs between the noise appearing at the drain of MISFET $Q_2$ and the noise appearing at the drain of MISFET $Q_1$.

In the case of noise of a low frequency, the potential difference between the drain of MISFET $Q_1$ and that of MISFET $Q_2$ that occurs due to this phase difference is relatively small. For this reason, the drain voltage of MISFET $Q_1$ is substantially changed in such a direction as to restrict the potential change of the output terminal $V_{out}$ by feedback and hence, the potential change of the output terminal $V_{out}$ is small in the case of power source noise of a low frequency.

In contrast, in the case of a power source noise of a relatively high frequency, e.g., around 300 KHz, the potential difference between the drain of MISFET $Q_1$ and that of MISFET $Q_2$ occurring due to the phase difference is relatively great, so that the drain voltage of MISFET $Q_1$ is changed in such a direction as to enlarge the potential change of the output terminal $V_{out}$ by applying feedback. Moreover, the capacitor $C_5$ forming the phase compensation circuit cannot cut the power source noise of a relatively high frequency but transmits it as such to the output terminal $V_{out}$. For these reasons, the potential change at the output terminal $V_{out}$ reaches a level that cannot be substantially neglected, in the case of power source noise of a relatively high frequency.

SUMMARY OF THE INVENTION

It is therefore an object of the present invention to provide an amplifier having a high power source noise repression ratio.

It is another object of the present invention to provide an amplifier suitable for integrated circuit configuration.

Other objects of the present invention will become more apparent from the following description to be taken in conjunction with the accompanying drawings.

BRIEF DESCRIPTION OF THE DRAWINGS

FIG. 6 shows a feedback resistor arrangement for use with the amplifier of FIG. 2.

DESCRIPTION OF THE PREFERRED EMBODIMENTS

Figure 2:
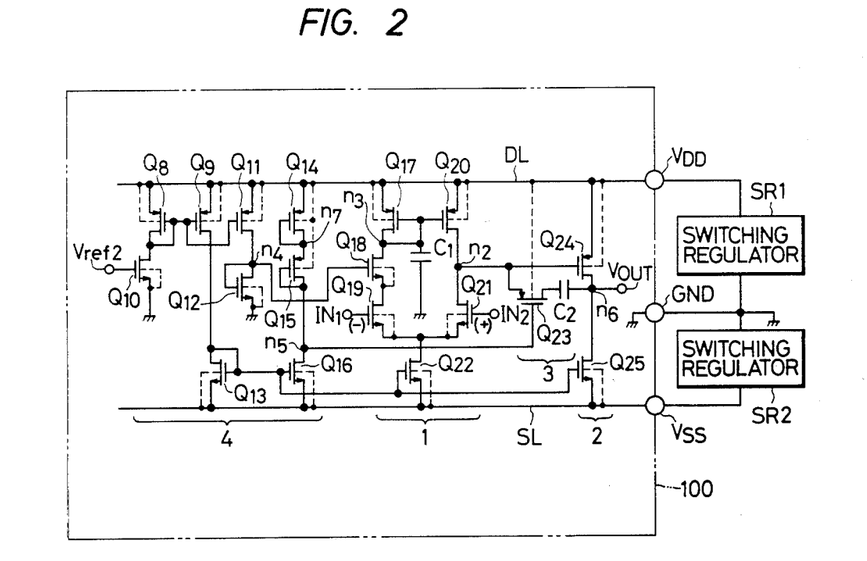
FIG. 2 is a circuit diagram of the amplifier in accordance with one embodiment of the present invention.

FIG. 2 shows an embodiment of the amplifier to which the present invention is applied.

The amplifier of this embodiment includes a differential input stage 1, an output amplification stage 2, a phase compensation circuit 3 and bias circuit 4.

In the diagram, each circuit encompassed by dot-and-chain line is formed on one semiconductor substrate by complementary MOS integrated circuit techniques.

The differential input stage 1 consists of a pair of differential input MISFETs $Q_{19}$ and $Q_{21}$, MISFET $Q_{18}$ having its source connected to the drain of MISFET $Q_{19}$, though the connection is not particularly limitative, load MISFETs $Q_{17}$ and $Q_{20}$ interposed between the drains of MISFETs $Q_{18}$ and $Q_{21}$ and a power source line DL and forming a current mirror circuit, a constant current MISFET $Q_{22}$ interposed between the common source of the differential input MISFETs $Q_{19}$ and $Q_{21}$ described above and a reference potential line SL and a capacitor $C_1$ interposed between the drain of the load MISFET $Q_{17}$ and a ground potential point.

The input MISFETs $Q_{19}$ and $Q_{21}$ and MISFET $Q_{18}$ are of an n-channel type while the load MISFETs $Q_{17}$ and $Q_{20}$ are of a p-channel type, and the constant current MISFET $Q_{22}$ is of the n-channel type, although these conductivity types are not particularly limitative.

The input MISFETs $Q_{19}$ and $Q_{21}$ have the same size and the same characteristics. Similarly, the load MISFETs $Q_{17}$ and $Q_{20}$ forming the current mirror circuit have the same size and the same characteristics. Thus, the offset voltage and drift current of the differential input stage 1 are reduced to minimum.

In the drawing, the substrate gates of the n-channel MISFETs $Q_{10}$, $Q_{12}$, $Q_{18}$, $Q_{19}$ and $Q_{21}$ are respectively connected to their sources as represented by dash line while the substrate gates of the other n-channel MISFETs are connected to the lowest potential point, that is, the reference potential line SL. The substrate gates of the p-channel MISFETs are connected to the highest potential point, that is, the power source line DL.

Since the potential of the substrate gate of each differential input MISFET is equal to its source potential, the transistor is not substantially affected by the characteristic change due to the known substrate effect. As a result, the limit to the input voltage range can be reduced.

The output amplification stage 2 consists of a p-channel MISFET $Q_{24}$ interposed between the output terminal $V_{out}$ and the power source line DL and a constant current MISFET $Q_{25}$ interposed between the drain of the p-channel MISFET $Q_{24}$ and the reference potential line SL.

The phase compensation circuit 3 consists of a p-channel MISFET $Q_{23}$ and a phase-compensating capacitor $C_2$ interposed in series between the drain of MISFET $Q_{21}$ described above and the output terminal $V_{out}$.

The bias circuit 4 consists of n-channel MISFETs $Q_{10}$, $Q_{12}$, $Q_{13}$ and $Q_{16}$ and p-channel MISFETs $Q_8$, $Q_9$, $Q_{11}$, $Q_{14}$ and $Q_{15}$.

The MISFET $Q_{13}$ forms a current mirror circuit in cooperation with the constant current MISFET $Q_{22}$ in the differential input stage 1, with the constant current MISFETs $Q_{25}$ in the output amplification stage 2 and with MISFET $Q_{16}$, and applies bias to these transistors.

The MISFET $Q_8$ forms a current mirror circuit in cooperation with MISFETs $Q_9$ and $Q_{11}$ and applies bias to them. A predetermined reference voltage $V_{ref2}$ is applied to the gate of MISFET $Q_{10}$ to keep suitable conductance. Accordingly, the voltage across the power source terminal $V_{DD}$ and the ground terminal GND is divided at the conductance ratio between the conductance of MISFET $Q_8$ and that of MISFET $Q_{10}$ and the constant voltage obtained by this voltage division is applied to each of MISFETs $Q_9$ and $Q_{11}$.

In consequence, the MISFET $Q_9$ is provided with suitable conductance. The voltage across the power source terminals $V_{DD}$ and $V_{ss}$ is divided at the conductance ratio between the conductance of this MISFET $Q_9$ and that of MISFET $Q_{13}$ and the resulting constant voltage is applied to each of the constant current MISFET $Q_{22}$ in the differential input stage 1, the constant current MISFET $Q_{25}$ in the output amplification stage 2 and to MISFET $Q_{16}$. As a result, MISFETs $Q_{16}$, $Q_{22}$ and $Q_{25}$ operate as the constant current sources.

The gate of each MISFET $Q_{14}$ and $Q_{15}$ is connected to its drain so as to form a kind of diode. Since MISFET $Q_{16}$ operates as the constant current source, the potential at a node $n_5$ is at a predetermined constant value. Since a predetermined potential is thus applied to MISFET $Q_{23}$ forming the phase compensation circuit 3, it operates as a kind of resistance element.

In this embodiment, the threshold voltages and characteristics of MISFETs $Q_{14}$ and $Q_{20}$ are set so that the potential at the node $n_7$ is substantially equal to that at the node $n_2$. The threshold voltage and characteristics of MISFET $Q_{15}$ are set so as to form a voltage, between the nodes $n_7$ and $n_5$, which corresponds to the voltage to be applied across the source and gate of MISFET $Q_{23}$ so that this transistor has a predetermined resistance value.

Accordingly, even when the potential of the power source voltage line DL changes, the resistance value of MISFET $Q_{23}$ can be held at a predetermined value. In other words, when the potential of the power source line DL changes, the potential of the node $n_2$, that is, the source potential of MISFET $Q_{23}$, changes in response to the former. In this case, the potential of each node $n_7$ and $n_5$ also changes in response to the potential change of the power source line DL. Since the potential changes of the nodes $n_2$ and $n_5$ are equal to each other, the voltage across the source and gate of MISFET $Q_{23}$ remains constant without being substantially affected by the potential change of the power source line DL. Thus, phase compensation can be made stably.

The drain of MISFET $Q_{12}$ is connected to the gate and the transistor operates a kind of diode. The potential of the node $n_4$ is substantially constant because MISFET $Q_{11}$ operates as a constant current source.

In this embodiment, the MISFET $Q_{18}$ is operated in the saturation range. The threshold values and characteristics of the constant current MISFET $Q_{11}$ and diode-connected MISFET $Q_{12}$ for forming the voltage to be applied to the gate of $Q_{18}$ are set so that MISFET $Q_{18}$ operates in the saturation range.

Since MISFET $Q_{18}$ is thus operated in the saturation range, the drain voltage of the differential input MISFET $Q_{19}$ can be kept substantially constant even when the potential of the power source voltage line DL changes due to noise or the like. In other words, the bias to the differential input MISFET $Q_{19}$ is hardly affected by the potential change of the power source voltage line DL.

This arrangement makes it possible to reduce the transmission of the power source noise from the input terminal $IN_1$ to the output terminal $V_{out}$ through a feedback circuit even if such a feedback circuit is disposed between the input terminal $IN_1$ and the output terminal $V_{out}$.

Unless MISFET $Q_{18}$ is disposed, the drain voltage of the differential input MISFET $Q_{19}$ will change in response to the potential change of the power source voltage line DL. As is well known, MISFETs have parasitic capacitance due to the overlap of their gate electrodes with the drain region. Accordingly, the fluctuation of the drain voltage of the differential input MISFET $Q_{19}$ is transmitted to its gate electrode and then to the output terminal $V_{out}$ through the feedback circuit. If the MISFET $Q_{18}$ which operates in the saturation range is disposed between the differential input MISFET $Q_{19}$ and its load circuit as is in the present embodiment, the drain voltage of the differential input MISFET can be kept substantially constant with respect to the potential change of the power source voltage line DL. As a result, it becomes possible to reduce the transmission of the power source noise from the input terminal to the output terminal through the feedback circuit.

In the embodiment, a capacitor $C_1$ is connected to the drain of the load MISFET $Q_{17}$ forming the current mirror circuit.

This capacitor $C_1$ has a capacitance such that the phase of the noise occurring at the node $n_2$ due to the power source noise becomes substantially equal to the phase of the noise occurring in the power source line DL due to the power source noise.

The inventors of the present invention examined the relation between the capacitance of the capacitor $C_1$ and the power source noise repression ratio (hereinafter referred to as "PSRR") using the experimental circuit illustrated in FIG. 3 and obtained effective PSRR in a range in which the capacitance of the capacitor $C_1$ was substantially equal to that of the capacitor $C_2$ described above. Here, PSRR represents the ratio of the amplitude $V_{IN}$ applied to the power source voltage to the change quantity $\Delta V_{out}$ of the output voltage $V_{out}$ thereby generated, as expressed by the following equation:

$$PSRR = 20 \log (V_{IN}/\Delta V_{out})(dB)$$

As can be seen clearly from this equation, the greater the PSRR, the more insensitive the amplification circuit becomes to the power source noise.

Next, the circuit tested by the inventors of the present invention and the test results will be described.

Figure 3:
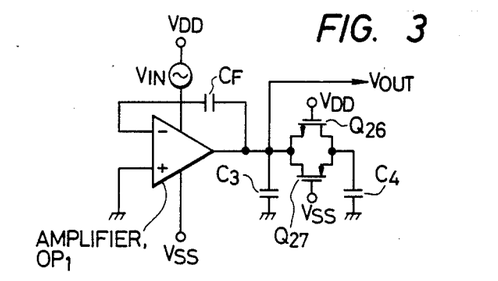
FIG. 3 is a circuit diagram of an experimental circuit to examine the characteristics of the amplifier.
Figure 4:
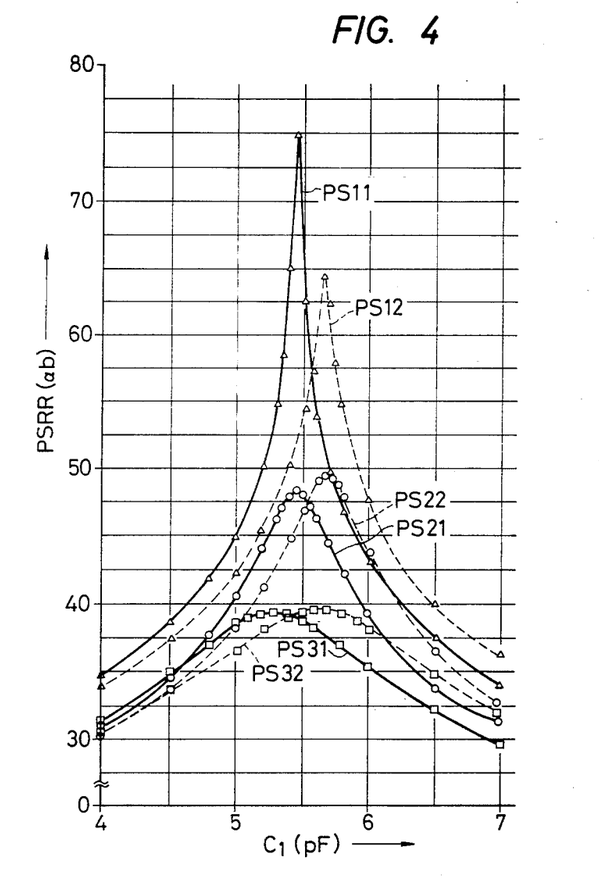
FIG. 4 is a characteristic diagram of the amplifier.

FIG. 3 is a circuit diagram of the experimental circuit and FIG. 4 shows the test results.

The experimental circuit is formed in view of the possibility that the amplification circuit shown in FIG. 2 is used in a switched capacitor. In other words, the experimental circuit consists of an amplification circuit $OP_1$ which is analogous to the amplifier shown in FIG. 2, a feedback capacitor $C_F$ connected between the inversion input terminal ($-$) and the output terminal, a load capacitor $C_3$, MISFETs $Q_{26}$ and $Q_{27}$ for simulating a switch in a switched capacitor and a capacitor $C_4$ for simulating a capacitor to which a charge is transferred in the switched capacitor. The ground potential is applied to the non-inversion input terminal of the amplification circuit $OP_1$, one of the electrodes of the capacitor $C_3$ and one of the electrodes of the capacitor $C_4$, and a stabilized voltage $V_{ss}$ is applied to the reference potential line SL of the amplification circuit $OP_1$ and to the gate of the p-channel MISFET $Q_{27}$. A stabilized voltage $V_{DD}$ is applied to the gate of the n-channel MISFET $Q_{26}$. The voltage $V_{DD}$ is also applied to the power source voltage line DL of the amplification circuit $OP_1$ through a signal generation circuit which generates noise. This signal generation circuit generates a sine wave of 300 KHz having a peak-to-peak amplitude of $\pm 100$ (mV). Accordingly, a voltage $V_{DD}$ to which 300 KHz noise with a peak-to-peak amplitude of $\pm 100$ (mV) is added to applied to the power source voltage line DL.

In this experimental circuit, the capacitance of the capacitor $C_3$ is set to 2 (pF) and that of the capacitor $C_4$, to 20 (pF). The phase-compensating capacitor $C_2$ (see FIG. 2) of the amplification circuit $OP_1$ is set to 5 (pF).

The threshold values of the N-channel MISFET and p-channel MISFET forming the experimental circuit are 0.75 (V) and $-0.56$ (V), respectively. The voltage $V_{DD}$ is 5 (V) with the voltage $V_{ss}$ being $-5$ (V). The reference voltage $V_{ref2}$ in the amplification circuit $OP_1$ is 2.5 (V), the experimental temperature is 27° C., and the capacitance of the feedback capacitor $C_F$ is 4 (pF). In FIG. 4, the PSRR value when the capacitance of the capacitor $C_1$ is changed from 4 (pF) to 7 (pF) is shown as PS21, and as PS22 when the capacitance of the feedback capacitor $C_F$ is 30 (pF). Table 2 illustrates the size W/L (W: channel width, L: channel length) and conductance of each MISFET forming the amplification circuit $OP_1$ in the two kinds of experiments described above (see FIG. 2).

The characteristic curves PS11, PS12, PS31 and PS32 represent the experimental results when the threshold voltage $V_{thn}$ of the n-channel MISFET, the threshold voltage $V_{thp}$ of the p-channel MISFET, the capacitance of the feedback capacitor $C_F$, the measuring temperature and the voltages $V_{DD}$ and $V_{ss}$ are set to those shown in Table 1, respectively.

Judging from the experimental results shown in FIG. 4, the PSRR value becomes higher if the capacitance of the capacitor $C_1$ is a little greater than the capacitance of the phase-compensating capacitor $C_2$ in the amplifier, e.g., about 5.5 (pF). In other words, the amplifier becomes more insensitive to the power source noise.

Since the capacitance of the capacitor $C_1$ is set to a relatively high value substantially equal to that of the phase-compensating capacitor $C_2$ as described above, the parasitic capacitance that is unavoidably generated when MISFETs $Q_{17}$, $Q_{18}$ and the like are formed cannot be used as the capacitor $C_1$. In this embodiment, therefore, the capacitor $C_1$ is disposed separately from the parasitic capacitance. An example of the structure of this capacitor $C_1$ will be described in further detail with reference to FIG. 5.

TABLE 1

| Characteristic curve | Threshold voltage (V) | Capacitance of feedback capacitor $C_F$ (pF) | Measuring temperature (°C.) | Power source voltage (V) | Reference voltage $V_{ref2}$ (V) |
|---|---|---|---|---|---|
| PS11 | $V_{ThN} = +0.90$ | 6 | 90 | $V_{DD} = 4.5$ | |
| PS12 | $V_{ThP} = -0.71$ | 30 | | $V_{ss} = -4.5$ | |
| PS21 | $V_{ThN} = +0.75$ | 6 | 27 | $V_{DD} = 5$ | 2.5 |
| PS22 | $V_{ThP} = -0.56$ | 30 | | $V_{ss} = -5$ | |
| PS31 | $V_{ThN} = +0.60$ | 6 | $-20$ | $V_{DD} = 5.5$ | |
| PS32 | $V_{ThP} = -0.41$ | 30 | | $V_{ss} = -5.5$ | |

TABLE 2

| MISFET | W/L (μm) | Mutual conductance $g_m$ (μ) | Source-drain conductance $g_{sd}$ (μ) |
|---|---|---|---|
| $Q_8$ | 114/8 | $4.40 \times 10^{-5}$ | $4.16 \times 10^{-7}$ |
| $Q_9$ | 114/8 | $4.78 \times 10^{-5}$ | $1.41 \times 10^{-7}$ |
| $Q_{11}$ | 114/8 | $4.43 \times 10^{-5}$ | $3.94 \times 10^{-7}$ |
| $Q_{14}$ | 96/8 | $4.05 \times 10^{-5}$ | $4.23 \times 10^{-7}$ |
| $Q_{15}$ | 21/10 | $1.46 \times 10^{-5}$ | $6.44 \times 10^{-7}$ |
| $Q_{17}$ | 120/10 | $3.75 \times 10^{-5}$ | $2.80 \times 10^{-7}$ |
| $Q_{20}$ | 120/10 | $3.77 \times 10^{-5}$ | $2.68 \times 10^{-7}$ |

TABLE 2-continued

| MISFET | W/L (μm) | Mutual conductance $g_m$ (℧) | Source-drain conductance $g_{sd}$ (℧) |
|---|---|---|---|
| $Q_{23}$ | 27.5/8 | $1.27 \times 10^{-12}$ | $2.96 \times 10^{-5}$ |
| $Q_{24}$ | 170/6 | $1.81 \times 10^{-4}$ | $2.38 \times 10^{-6}$ |
| $Q_{10}$ | 10/27 | $1.04 \times 10^{-5}$ | $6.86 \times 10^{-8}$ |
| $Q_{12}$ | 10/70 | $6.08 \times 10^{-6}$ | $2.94 \times 10^{-8}$ |
| $Q_{13}$ | 120/16 | $5.49 \times 10^{-5}$ | $1.27 \times 10^{-7}$ |
| $Q_{16}$ | 75/12 | $4.98 \times 10^{-5}$ | $5.80 \times 10^{-8}$ |
| $Q_{18}$ | 100/20 | $4.07 \times 10^{-5}$ | $8.06 \times 10^{-8}$ |
| $Q_{19}$ | 300/10 | $1.05 \times 10^{-4}$ | $5.85 \times 10^{-8}$ |
| $Q_{21}$ | 300/10 | $1.05 \times 10^{-4}$ | $4.70 \times 10^{-8}$ |
| $Q_{22}$ | 200/16 | $9.30 \times 10^{-5}$ | $1.05 \times 10^{-7}$ |
| $Q_{25}$ | 150/6 | $2.87 \times 10^{-4}$ | $1.25 \times 10^{-6}$ |

Referring back again to FIG. 2, description will be made as to why PSRR of the amplifier can be improved by making the phase of the noise appearing at the node $n_2$ substantially equal to that of the noise appearing in the power source line DL.

The amplifier of this embodiment is used while the feedback circuit is interposed between the output terminal $V_{out}$ and the inversion input terminal $IN_1$. As the feedback circuit, a circuit consisting of a resistance element, (e.g. the resistor R shown in FIG. 6, where the amplifier $OP_1$ corresponds to the amplifier of FIG. 2) a capacitor, a wiring or a parallel connection of a capacitor and a switching element is used. When an integration circuit is to be formed by use of this amplifier, for example, a capacitor or a parallel circuit of a capacitor and a switching element is used as the feedback circuit as is known well in the art. When a voltage follower circuit is to be formed by this amplifier, a wiring is used as the feedback circuit. In these cases, the ground potential is generally applied to the non-inversion input terminal of the amplifier, though such is not particularly limitative.

Unless the capacitor $C_1$ is disposed, the capacitance value coupled with the node $n_3$ becomes smaller than the capacitance value coupled with the node $n_2$. When the potential of the power source line DL is raised by noise of a relatively high frequency, for example, the potential at the node $n_3$ rises in response to the rise of the potential and the potential at the node $n_2$ then rises. The potential at the node $n_6$ rises due to the potential rise of the node $n_2$ and that of the power source line DL. The potential rise of the node $n_6$ is transmitted to the gate of MISFET $Q_{19}$ through the feedback circuit. Since it is noise of a high frequency, the potential at the node $n_3$ drops to a relatively low level in this time. The potential at the node $n_3$ is further reduced by MISFET $Q_{19}$. Accordingly, the potential at the node $n_3$ drops to a low level, whereby MISFET $Q_{20}$ substantially the potential at the node $n_2$. Since the gate potential of the p-channel MISFET $Q_{24}$ is greatly raised, the potential at the node $n_6$ is remarkably reduced. Since the potential at the output terminal $V_{out}$ is thus reduced greatly, noise develops.

In contrast, if the capacitor $C_1$ is disposed as in this embodiment, the potential at the node $n_3$ is kept at a relatively high value when the potential rise at the node $n_6$ is transmitted to the gate of MISFET $Q_{19}$ through the feedback circuit. For this reason, even when the potential at the node $n_3$ is reduced, the potential is at a higher value than when the capacitor $C_1$ is not disposed. In other words, the potential rise at the node $n_2$ is limited to a value lower than when the capacitor $C_1$ is not disposed, so that it is possible to prevent the potential at the output terminal $V_{out}$ from being reduced excessively by MISFET $Q_{24}$.

In other words, it is possible to minimize the potential change at the output terminal and to improve PSRR. Since the amplitude of the potential at the node $n_2$ is limited, it also becomes possible to minimize the potential change transmitted to the output terminal $V_{out}$ through the phase compensation circuit.

Though the improvement for noise of a high frequency has now been explained, PSRR of the amplifier in situations involving noise in the low frequency range can also be improved in the case of noise of a low frequency because the potential change at the node $n_2$ is limited.

The foregoing explains the case where the feedback circuit is disposed, but PSRR of the amplifier can be improved also in the case where the feedback circuit is not disposed, by connecting a capacitor $C_1$ having such a capacitance that the phase of the noise in the power source line DL becomes substantially the same as the phase of the noise appearing at the node $n_2$, to the node $n_3$.

Unless such a capacitor $C_1$ is disposed, when, for example, the potential of the power source line DL rises due to the power source noise, the potential at the node $n_3$ also rises substantially simultaneously. Since the phase compensation circuit is connected to the node $n_2$, however, the potential at the node $n_2$ rises later than the potential rise of the power source line DL. Accordingly, a relatively large voltage is applied across the source and gate of the p-channel MISFET $Q_{24}$. The conductance of this MISFET $Q_{24}$ thus becomes relatively great, causing a relatively large change of the potential at the node $n_6$. In other words, noise appears at the output terminal $V_{out}$.

When the capacitor $C_1$ is connected to the node $n_3$, on the other hand, the phase of the noise occurring at the node $n_3$ is retarded from the noise in the power source line DL. In other words, since a delay circuit is composed of the conductance of MISFET $Q_{17}$ and the capacitor $C_1$, the potential change at the node $n_3$ is much more delayed than the potential change in the power source line DL. When, for example, the potential in the power source line DL rises due to the power source noise, the potential at the node $n_3$ rises later than the potential rise of the power source line DL, so that a relatively large voltage is applied across the source and gate of the p-channel MISFET $Q_{20}$, thereby increasing the conductance of MISFET $Q_{20}$ and speeding up the potential rise at the node $n_2$.

As can be understood from the description above, the phase of the potential change occurring at the node $n_2$ can be regulated by controlling the capacitance of the capacitor $C_1$. Accordingly, the phase of the potential change occurring at the node $n_2$ can be made substantially the same as the phase of the potential change in the power source line DL by setting the capacitance of the capacitor $C_1$ to an appropriate value (substantially equal to capacitance of the capacitor $C_2$ in this embodiment), so that the voltage applied across the source and gate of the p-channel MISFET $Q_{24}$ becomes smaller than when the capacitor $C_1$ is not disposed. Hence, the conductance of MISFET $Q_{24}$ becomes smaller than when the capacitor $C_1$ is not disposed and the potential change at the node $n_6$ becomes smaller. In other words, the noise appearing at the output terminal $V_{out}$ due to the power source noise can be reduced and PSRR of the amplifier can be improved.

The amplifier shown in FIG. 3 can obtain high PSRR such as shown in FIG. 4 due to the two reasons described above.

In FIG. 2, SR1 is a switching regulator which forms a positive voltage $V_{DD}$ with respect to the ground potential and SR2 is a switching regulator which forms a negative voltage $V_{ss}$ with respect to the ground potential.

The switching regulator consists of a switching element, a transformer to which an input voltage switched by the switching element is applied and which forms an output voltage, and a stabilization circuit which receives the output voltage generated by the transformer and controls the switching element so that its output voltage reaches a predetermined value, though this construction is not particularly limitative.

Upon the switching operation of the switching element, the switching regulator forms the output voltage. Undesirable noise unavoidably adds to the output voltage generated from the regulator due to the switching operation. The operation speed of the switching operation has been increased in order to reduce the size and weight of the switching regulator. This results in the problem that undesirable noise of a relatively high frequency, e.g., about 300 KHz, adds to the output voltage generated by the switching regulator.

The characterizing features of a switching regulator such as the compact size and light weight can be effectively utilized if the switching regulator is used as the power feed device for the amplifier which is highly resistive to the power source noise as in this embodiment.

As described above, an amplifier having high PSRR can be obtained by the simple construction in which only a capacitor is disposed.

Figure 5:
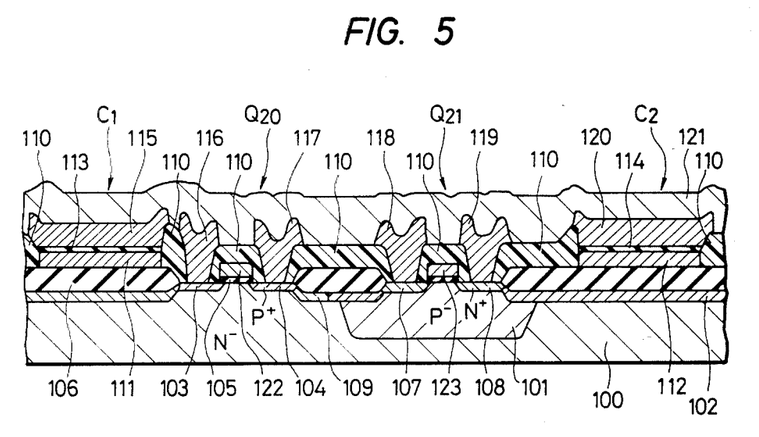
FIG. 5 is a sectional view of an MIS integrated circuit.

FIG. 5 is a sectional view of an MIS integrated circuit incorporating therein the amplifier described above.

Next, the structure of each of the above-mentioned capacitors $C_1$, $C_2$, as well as that of a p-channel MISFET and a n-channel MISFET will be described. The load MISFET $Q_{20}$ and the differential input MISFET $Q_{21}$ will be dealt with as the typical examples of the p- and n-channel MISFETS, respectively.

A polysilicon layer 111 formed on an N-type single crystal silicon substrate 100 via a relatively thick oxide film 106 forms one of the electrodes of the capacitor $C_1$ and a silicon oxide layer 113 forms the dielectric layer of the capacitor $C_1$. An aluminum layer 115 formed on the polysilicon layer 111 via this silicon oxide layer 113 forms the other electrode of the capacitor $C_1$. Similarly, a polysilicon layer 112 formed on the N-type single crystal silicon substrate 100 via the relatively thick oxide film 106 forms one of the electrodes of the capacitor $C_2$ and a silicon oxide layer 114 forms the dielectric layer of the capacitor $C_2$. An aluminum layer 120 formed on the polysilicon layer 112 via this silicon oxide layer 114 forms the other electrode of the capacitor $C_2$.

Since the layers forming the electrodes of each capacitor are separated from each other and from the substrate by the relatively thick silicon oxide film 106, the parasitic capacitance that would be otherwise formed between the electrodes and the substrate can be reduced. Accordingly, the capacitor $C_1$ ($C_2$) having a desired value can be formed between the node $n_3$ (the node $n_6$) and the ground potential point (the drain of MISFET $Q_{23}$) by selecting suitably the areas of the aluminum layer and polysilicon layer forming the electrode or the thickness of the silicon oxide film forming the dielectric layer.

Though not particularly limitative, the aluminum layer 115 forming the other electrode of the capacitor $C_1$ is connected to the node $n_2$ (see FIG. 2) and the polysilicon layer 111 forming one electrode, to the ground potential point. The aluminum layer 120 forming the other electrode of the capacitor $C_2$ is connected to one of the electrodes of MISFET $Q_{23}$ and the polysilicon layer 112 forming one electrode of the capacitor $C_2$, to the node $n_6$ (see FIG. 2).

The p-channel MISFET $Q_{20}$ consists of p-type diffusion regions 103, 104 formed on the n-type silicon substrate 100 and the gate electrode 122 consisting of the polysilicon layer formed on the substrate 100 via a relatively thin gate oxide layer 105. The n-channel MISFET $Q_{21}$ consists of n-type diffusion regions 107, 108 formed in a p-type well region and the gate electrode 123 consisting of a polysilicon layer formed on the well region via a gate oxide layer.

Next, the method of fabricating this MIS integrated circuit will be explained.

(A) p$^-$ type well region 101 is first formed on the N$^-$ type single crystal silicon substrate 100 in a region where the n-channel MISFET $Q_{21}$ is to be formed. A silicon oxide layer and then a silicon nitride layer are formed in the p$^-$ type well region 101 and the region where the p-channel MISFET $Q_{20}$ is to be formed. Boron and phosphorus are selectively diffused, relatively, into the region where this silicon nitride layer is not formed, thereby forming channel stoppers 102 and 109. The surface of the silicon substrate is then oxidized selectively using the silicon nitride layer as the mask, thus forming a field oxide layer 106.

(B) After the silicon oxide layer and the silicon nitride layer are removed, the surface of the regions where MISFETs $Q_{20}$ and $Q_{21}$ are to be formed is oxidized, forming a thin gate oxide layer (silicon oxide layer) 105.

(C) Polysilicon is deposited by chemical vapor deposition to the entire surfaces of the field oxide layer 106 and gate oxide layer 105, and is selectively etched by photoetching to form polysilicon layers 122, 123, 111 and 112 so as to leave the portions where the gate electrodes 122 and 123 and one electrode 111 and 112 of each capacitor $C_1$ and $C_2$ are to be formed. Next, the gate oxide layer exposed by photoetching is removed by etching.

(D) A photoresist mask is formed in the region where the n-channel MISFET is to be formed and diffusion of a p-type impurity is effected using boron or the like. Thus, the gate electrodes (polysilicon layers) 122 and the polysilicon layers 111 and 112 come to have low resistance. At the same time, boron is doped to the main surface of the silicon substrate 100 in self-registration with the gate electrode 122, thereby forming the p$^+$ type diffusion regions as the source and drain regions 103 and 104.

(E) After the photoresist mask formed at the step (D) is removed, another photoresist mask is formed in the region where the p-channel MISFET $Q_{20}$ is to be formed, and an n-type impurity such as phosphorus is diffused. Thus, the gate electrode (polysilicon layer) 123 comes to have low resistance. At the same time, phosphorus is doped to the main surface of the p$^-$ type well region 101 by self-registration and n$^+$ type diffusion regions as the drain and source regions 107 and 108 are formed.

(F) After the photoresist mask formed at the step (E) is removed, a phospho-silicate glass layer 110 is formed on the entire surface by chemical vapor deposition. This phosphosilicate glass layer on the surfaces of the polysilicon layers 111 and 112, that form one each electrode of the capacitors $C_1$ and $C_2$, is removed by photoetching. The surfaces of the polysilicon layers 111 and 112 thus exposed are then oxidized to form silicon oxide layers 113 and 114 as the dielectric layers of the capacitors $C_1$ and $C_2$.

(G) Contact holes are bored on the phosphosilicate glass in the source and drain regions 103, 108 and 104, 107 of MISFETs $Q_{20}$ and $Q_{21}$ and on the phospho-silicate glass on the polysilicon layers 111 and 112 of the capacitors $C_1$ and $C_2$. Incidentally, the contact hole formed on the phosphosilicate glass on the polysilicon layers 111 and 112 is not shown in the drawing.

(H) An aluminum layer is deposited on the entire surface by vapor deposition or the like and etching is then effected in a desired shape. Aluminum wiring layers 116, 117, 118 and 119 as well as aluminum layers 115 and 120 covering the polysilicon layers 111 and 112 and then formed.

(I) A final passivation layer 121 is formed on the aluminum wiring layers and aluminum layers to complete the MIS integrated circuit such as depicted in FIG. 5.

Incidentally, the n-channel MISFET $Q_{21}$ is formed on the same p-type well region as MISFET $Q_{19}$, MISFET $Q_{10}$ is formed in the same p-type well region as MISFET $Q_{12}$ and MISFET $Q_{13}$, in the same p-type well region as MISFETs $Q_{16}$, $Q_{22}$ and $Q_{25}$. The source region of each MISFET is electrically connected to the p-type well region in which it is formed. This arrangement can reduce the characteristic change due to the substrate effect.

The layers 113 and 114 forming the dielectric of the capacitors $C_1$ and $C_2$ may be nitrate layers, respectively. In this case, the capacitors $C_1$ and $C_2$ having high capacitance can be obtained easily because the dielectric constant of nitrite is higher than that of silicon oxide. In the embodiment described above, one of the electrodes of each capacitor $C_1$ and $C_2$ consists of polysilicon doped with a p-type impurity, but it may be also composed of polysilicon to which an n-type impurity is doped.

Though the amplifier that operates on the two kinds of power source voltages $V_{DD}$ and $V_{ss}$ has been described, the embodiment is not limitative in particular. For instance, the present invention can be also applied to the amplifier which operates on one kind of power source voltage $V_{DD}$.

The amplifier to which the present invention is applied is used as an operational amplification circuit forming a CODEC integrated circuit, for example, to improve the power source noise repression ratio of the CODEC integrated circuit as a whole. However, the present invention is not particularly limited thereto but can be widely applied to those amplifiers (operational amplifiers), as means for improving their PSRR.

Depending upon the fabrication condition of an MIS integrated circuit, the phase of the noise at the node $n_2$ can be made substantially equal to that of the noise in the power source line even if the capacitance of the capacitor $C_1$ is not substantially equal to that of the phase compensating capacitor $C_2$, thereby improving the PSRR of the amplifier. The capacitance of the capacitor $C_1$ can be varied depending upon the intended PSRR value.

The phase compensation circuit described above is not particularly limitative, either.

While some preferred embodiments of the present invention have thus been described, it is understood that the same is not limited but is susceptible of numerous changes and modifications as known to those skilled in the art without departing from the spirit or scope of the following claims.

What is claimed is:

1. An amplifier comprising:
   a non-inverting input terminal;
   an inverting input terminal;
   a first differential input field effect transistor of a first conductivity type, having the gate thereof connected to said inverting input terminal;
   a second differential input field effect transistor of the first conductivity type, having the gate thereof connected to said non-inverting input terminal;
   an active load circuit having a first terminal to which the drain of said first differential input field effect transistor is connected, a second terminal to which the drain of said second differential input field effect transistor is connected, a third terminal to which a power source terminal is connected, and a control element connected between said second and third terminal and having the conductance thereof controlled in accordance with the potential of said first terminal;
   a phase compensation circuit connected to said second terminal of said active load circuit;
   a feedback circuit applying an output signal generated on the basis of a signal occurring at said second terminal of said active load circuit to said inverting input terminal; and
   a phase regulation circuit connected to said first terminal so that the phase of a potential change of a power source voltage applied to said power source terminal becomes substantially equal to the phase of a potential change occurring at said second terminal of said active load circuit due to the voltage change of the power source voltage.

2. The amplifier as defined in claim 1 wherein said active load circuit comprises a current mirror circuit and a first constant current circuit connected to the sources of said first and second differential input field effect transistors.

3. The amplifier as defined in claim 1 which further comprises a third field effect transistor which is connected between said first terminal of said active load circuit and the drain of said first differential input field effect transistor and is operated in a saturation range.

4. The amplifier as defined in claim 3 wherein said phase regulation circuit comprises a first capacitor connected between said first terminal and a predetermined potential terminal.

5. The amplifier as defined in claim 4 wherein said active load circuit comprises a current mirror circuit and a second constant current circuit connected to the sources of said first and second differential input field effect transistors.

6. The amplifier as defined in claim 5 wherein said first capacitor comprises a first conductivity layer formed on the main surface of a semiconductor substrate via a field insulation film, an insulating layer formed on the surface of said first conductivity layer and a second conductivity layer formed on said first conductive layer via said insulating layer.

7. The amplifier as defined in claim 5 wherein said current mirror circuit comprises a fourth field effect transistor of a second conductivity type having the source thereof connected to said third terminal, the drain thereof connected to said second terminal and the gate thereof connected to said first terminal, and a non-linear element connected between said third terminal and said first terminal.

8. The amplifier as defined in claim 7 wherein said non-linear element comprises a fifth field effect transistor of the second conductivity type having the source thereof connected to said third terminal and the gate and drain thereof connected to said first terminal.

9. The amplifier as defined in claim 7 wherein said phase compensation circuit comprises a first resistance element and a second capacitor.

10. The amplifier as defined in claim 9 which further comprises an output terminal receiving an output signal formed on the basis of a signal occurring at said second terminal of said current mirror circuit, and in which said phase compensation circuit comprises said first resistance element and said second capacitor that are connected in series between said second terminal and said output terminal.

11. The amplifier as defined in claim 10 wherein said first resistance element is comprised of the main conductor line of a sixth field effect transistor receiving at the gate thereof a suitable voltage.

12. The amplifier as defined in claim 10 which further comprises an output circuit receiving a signal generated at said second terminal of said current mirror circuit and generating said output signal on the basis of said signal received.

13. The amplifier as defined in claim 12 wherein said output circuit comprises a seventh field effect transistor of the second conductivity type, having the source thereof connected to said power source terminal, the drain thereof connected to said output terminal and the gate thereof connected to said second terminal of said current mirror circuit, and a third constant current circuit connected to said output terminal.

14. The amplifier as defined in claim 10 wherein said feedback circuit is comprised of a second resistance element connected between said output terminal and said inverting input terminal.

15. The amplifier as defined in claim 10 wherein said feedback circuit is comprised of a third capacitor connected between said output terminal and said inverting input terminal.

16. The amplifier as defined in claim 10 wherein said feedback circuit is comprised of a wiring connected to said output terminal and to said inverting input terminal.

17. The amplifier as defined in claim 2 wherein said current mirror circuit further comprises an eighth field effect transistor of the second conductivity type, having the source thereof connected to said third terminal, the drain thereof connected to said second terminal and the gate thereof connected to said first terminal, and a non-linear element connected between said third and first terminals.

18. The amplifier as defined in claim 17 wherein said non-linear element comprises a ninth field effect transistor of the second conductivity type, having the source thereof connected to said third terminal and the gate and drain thereof connected to said first terminal.

19. The amplifier as defined in claim 18 wherein said phase compensation circuit comprises a fourth capacitor electrically connected to said second terminal.

20. The amplifier as defined in claim 19 which further comprises an output terminal connected to said second terminal via said fourth capacitor of said phase compensation circuit, a tenth field effect transistor of the second conductivity type, having the gate thereof connected to said second terminal, the source thereof connected to said power source terminal and the drain thereof connected to said output terminal, and a fourth constant current circuit connected to said output terminal.

21. An amplifier comprising:
a first differential input field effect transistor of a first conductivity type;
a second differential input field effect transistor of the first conductivity type;
an active load circuit having a first terminal to which the drain of said first differential input field effect transistor is connected, a second terminal to which the drain of said second differential input field effect transistor is connected, a third terminal to which a power source terminal is connected, and a control element which is connected between said second and third terminals and whose conductance is controlled in accordance with the potential at said first terminal;
a phase compensation circuit connected to said second terminal of said active load circuit;
an output circuit having a fourth terminal to which said power source terminal is connected, and generating an output signal on the basis of the potential at said second terminal of said active load circuit; and
a phase regulation circuit connected to said first terminal so that the phase of a potential change of a power source voltage applied to said power source terminal and the phase of a potential change occurring at said second terminal of said active load circuit due to the potential change of said power source voltage become substantially equal to each other.

22. The amplifier as defined in claim 21 wherein said phase regulation circuit comprises a first capacitor connected between said first terminal and a predetermined power source terminal.

23. The amplifier as defined in claim 22 wherein said active load circuit comprises a third field effect transistor of a second conductivity type, having the gate thereof connected to said first terminal, the source thereof connected to said third terminal and the drain thereof connected to said second terminal, and a load element connected between said first and third terminals.

24. The amplifier as defined in claim 23 wherein said output circuit comprises a fourth field effect transistor of the second conductivity type, having the source thereof connected to said fourth terminal and the gate thereof connected to said second terminal of said active load circuit.

25. The amplifier as defined in claim 24 wherein said load element of said active load circuit comprises a fifth field effect transistor of the second conductivity type, having the source thereof connected to said third terminal and the gate and drain thereof connected to said first terminal.

26. An amplifier as defined in claim 9, wherein said first capacitor has a capacitance value substantially equal to or greater than a capacitance value of said second capacitor.

27. An amplifier as defined in claim 4, wherein said phase compensation circuit comprises a first resistance element and a second capacitor and wherein said first capacitor has a capacitance value substantially equal to or greater than a capacitance value of said second capacitor.

28. An amplifier as defined in claim 26, wherein said first capacitor is disposed separately of parasitic capacitance generated by transistors of said amplifier.

29. An amplifier as defined in claim 27, wherein said first capacitor is disposed separately of parasitic capacitance generated by transistors of said amplifier.

30. An amplifier as defined in claim 22, wherein said phase compensation circuit comprises a first resistance element and a second capacitor and wherein said first capacitor has a capacitance value substantially equal to or greater than a capacitance value of said second capacitor.

31. An amplifier as defined in claim 30, wherein said first capacitor is disposed separately of parasitic capacitance generated by transistors of said amplifier.

32. An amplifier as defined in claim 26, wherein both said first and second capacitors are comprised of a first conductivity layer formed on the main surface of a semiconductor substrate via a field insulating film, an insulating layer formed on the surface of said first conductivity layer and a second conductivity layer formed on said first conductivity layer via said insulating layer.

33. An amplifier as defined in claim 27, wherein both said first and second capacitors are comprised of a first conductivity layer formed on the main surface of a semiconductor substrate via a field insulating film, an insulating layer formed on the surface of said first conductivity layer and a second conductivity layer formed on said first conductivity layer via said insulating layer.

34. An amplifier as defined in claim 30, wherein both said first and second capacitors are comprised of a first conductivity layer formed on the main surface of a semiconductor substrate via a field insulating film, an insulating layer formed on the surface of said first conductivity layer and a second conductivity layer formed on said first conductivity layer via said insulating layer.

* * * * *